United States Patent
Venturini et al.

(10) Patent No.: US 12,288,592 B2
(45) Date of Patent: Apr. 29, 2025

(54) PERFORMING SENSE OPERATIONS IN MEMORY

(71) Applicant: Micron Technology, Inc., Boise, ID (US)

(72) Inventors: Michele Maria Venturini, Milan (IT); Umberto Di Vincenzo, Capriate San Gervasio (IT); Ferdinando Bedeschi, Biassono (IT); Riccardo Muzzetto, Arcore (IT); Christophe Vincent Antoine Laurent, Agrate Brianza (IT); Christian Caillat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 314 days.

(21) Appl. No.: 17/873,991

(22) Filed: Jul. 26, 2022

(65) Prior Publication Data

US 2024/0038322 A1 Feb. 1, 2024

(51) Int. Cl.
*G11C 29/50* (2006.01)

(52) U.S. Cl.
CPC .......... *G11C 29/50004* (2013.01); *G11C 2029/5004* (2013.01)

(58) Field of Classification Search
CPC .......... G11C 11/5678; G11C 13/0004; G11C 2013/0052; G11C 13/004; G11C 29/50004; G11C 2029/5004
See application file for complete search history.

(56) References Cited

U.S. PATENT DOCUMENTS

| | | | |
|---|---|---|---|
| 10,714,185 B2 | 7/2020 | Sforzin et al. | |
| 11,177,009 B2 | 11/2021 | Hirst et al. | |
| 11,244,739 B2 | 2/2022 | Vincenzo et al. | |
| 11,315,633 B2 | 4/2022 | Castro et al. | |
| 2021/0217470 A1* | 7/2021 | Di Vincenzo | G11C 13/004 |
| 2023/0386543 A1* | 11/2023 | Tran | G11C 11/161 |

FOREIGN PATENT DOCUMENTS

WO 2021176244 A1 9/2021

OTHER PUBLICATIONS

U.S. Appl. No. 17/044,150, entitled, "Counter-Based Methods and Systems for Accessing Memory Cells" filed May 13, 2020, 49 pages.

* cited by examiner

*Primary Examiner* — Uyen Smet
(74) *Attorney, Agent, or Firm* — Brooks, Cameron & Huebsch, PLLC

(57) ABSTRACT

Apparatuses, methods, and systems for performing sense operations in memory are disclosed. The memory can have a group of memory cells, and circuitry can be configured to perform a sense operation on the group, wherein performing the sense operation includes performing a first sense operation in a first polarity on the group of memory cells to determine a quantity of the memory cells of the group that are in a particular data state, and performing a second sense operation in a second polarity on the group of memory cells to determine a data state of the memory cells of the group. The second polarity is opposite the first polarity, and the second sense operation is a count-based sense operation that uses the determined quantity of memory cells in the particular data state as a counting threshold to determine the data state of the memory cells of the group.

20 Claims, 5 Drawing Sheets

PERFORMING SENSE OPERATIONS IN MEMORY

TECHNICAL FIELD

The present disclosure relates generally to semiconductor memory and methods, and more particularly, to performing sense operations in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in various architectures, such as a vertical pillar architecture with memory cells (e.g., resistance variable cells) arranged in word line layers, or a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
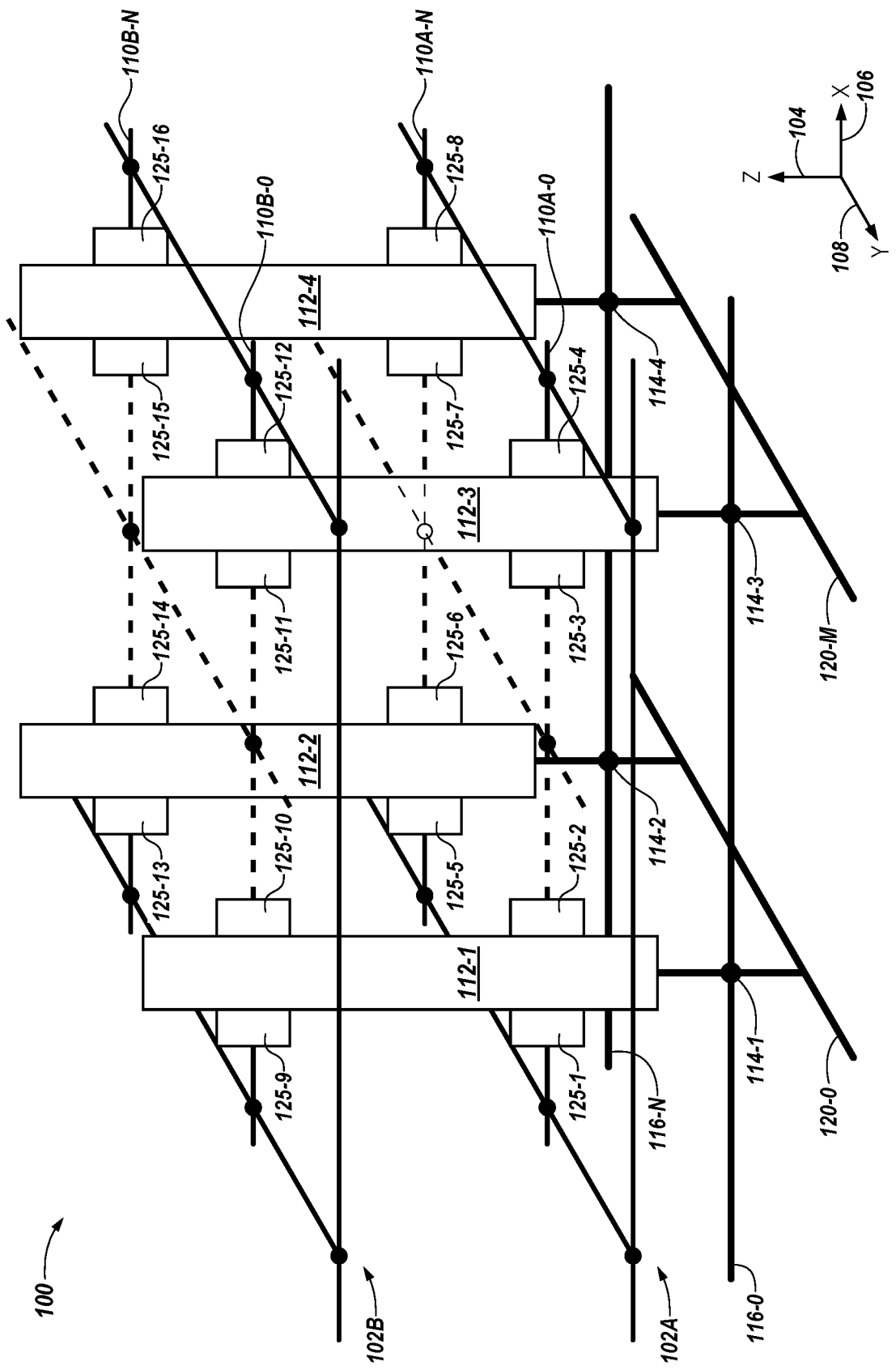
FIG. 1 is a three-dimensional view of a portion of an example of a memory array, in accordance with an embodiment of the present disclosure.

The present disclosure includes apparatuses, methods, and systems for performing sense operations in memory. The memory can have a group of memory cells, and circuitry can be configured to perform a sense operation on the group of memory cells, wherein performing the sense operation includes performing a first sense operation in a first polarity on the group of memory cells to determine a quantity of the memory cells of the group that are in a particular data state, and performing a second sense operation in a second polarity on the group of memory cells to determine a data state of the memory cells of the group. The second polarity is opposite the first polarity, and the second sense operation is a count-based sense operation that uses the determined quantity of memory cells in the particular data state as a counting threshold to determine the data state of the memory cells of the group.

As discussed further herein, a resistance variable memory cell, such as a self-selecting memory cell, can be programmable to one of three different data states, and a sense operation can be performed on the cell to determine the data state to which the cell has been programmed. Further, a memory device can address such memory cells (e.g., resistance variable memory cells) for such operations (e.g., sense and program operations) in groups (e.g., packets) called words or codewords.

Sense operations performed on such a group (e.g., codeword) of memory cells (e.g., resistance variable memory cells) in accordance with the present disclosure can be faster and/or more accurate than previous sense operations. For example, a sense operation in accordance with the present disclosure can use (e.g., combine) two different sense operations (e.g., two different types of sensing algorithms) to improve the speed at which the state of the memory cell is determined, and the accuracy of the determined state. For instance, the first of the two sense operations can be a relatively faster, but lower accuracy, sense operation that has a relatively larger sense window, and the second of the two sense operations can be a relatively slower, but higher accuracy, sense operation that has a relatively smaller sense window.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of a portion of an example of a memory array 100 (e.g., a three-dimensional vertical pillar memory array), in accordance with an embodiment of the present disclosure. Memory array 100 may include a plurality of first signal lines (e.g., first access lines), which may be referred to as word lines 110A-0 to 110A-N and 110B-0 to 110B-N, and a plurality of second signal lines (e.g., second access lines), which may be referred to as sense (e.g., digit or bit) lines 120-0 to 120-M.

FIG. 1 shows a plurality of planes 102A, 102B (e.g., layers or levels). While two planes are shown in FIG. 1, embodiments are not so limited, and may include more than two planes. As shown in FIG. 1, the planes 102A, 102B are separated in a z-direction 104 (e.g., separated vertically) from one another. FIG. 1 further illustrates an x-direction 106 (e.g., a first horizontal direction) and a y-direction 108 (e.g., a second horizontal direction). While not shown in FIG. 1, for clarity and so as not to obscure embodiments of the present disclosure, components of the memory array 100, as well as different layers of the memory array 100 may be separated by an insulation material (e.g., a dielectric material).

The memory array 100 may include a number of conductive pillars 112-1, 112-2, 112-3, 112-4. The conductive pillars 112-1, 112-2, 112-3, 112-4 can comprise a metallic (or semi-metallic) material or a semiconductor material such as a doped polysilicon material, among others. Various types of conductive pillars may be utilized. For instance, the conductive pillars 112-1, 112-2, 112-3, 112-4 may be tubular, or have other shapes. The conductive pillars 112-1, 112-2, 112-3, 112-4 may have a hollow center or a solid center, for example.

As shown in FIG. 1, each of the conductive pillars 112-1, 112-2, 112-3, 112-4 may be respectively coupled to a sense line 120-0 to 120-M via a select element 114-1, 114-2, 114-3, 114-4 (e.g., switch). An example of the select element is a thin-film transistor (tft); however, embodiments are not so limited. The select element 114-1, 114-2, 114-3, 114-4 can be driven by a gate line 116-0 to 116-N, for example. Activating (e.g., biasing) a select element coupled to a particular conductive pillar may provide that an operation (e.g., a sense operation or a programming operation) may be performed on one or more memory cells coupled to the particular conductive pillar.

As shown in FIG. 1, the memory array 100 includes a number of memory cells 125-1 to 125-16. Each of the memory cells 125-1 to 125-16 can be coupled to one of the first signal lines 110. For instance, as shown in FIG. 1, memory cells 125-1 to 125-4 are coupled to first signal line 110A-0, while memory cells 125-13 to 125-16 are coupled to first signal line 110B-N. Each of the memory cells 125-1 to 125-16 can be coupled to one of the conductive pillars 112. For instance, as shown in FIG. 1, memory cells 125-1 and 125-2 are coupled to conductive pillar 112-1, while memory cells 125-15 and 125-16 are coupled to conductive pillar 112-4. Each of the memory cells 125-1 to 125-16 can be coupled to one of the second signal lines 120. For instance, as shown in FIG. 1, memory cells 125-1, 125-2, 125-5, 125-6, 125-9, 125-10, 125-13 and 125-14 are coupled to second signal line 120-0, while memory cells 125-3, 125-4, 125-7, 125-8, 125-11, 125-12, 125-15 and 125-16 are coupled to second signal line 120-M.

The memory cells 125 may be programmable to one of three different data states, as will be further described further herein. Further, a group of the memory cells 125 can comprise a codeword, which can refer to a logical unit of a memory device used to store data. Such three-state programming can be useful in supporting complex memory operations, such as, for instance, machine learning applications, in which data is encoded and matching functions or partial matching functions (e.g., Hamming distances) are computed. For instance, such three-state programming can support the computation of the matching function or partial matching function of an input vector pattern with many stored vectors in an efficient manner.

The memory cells 125 may be resistance variable memory cells, for example. The memory cells 125 may include a material programmable to different data states (e.g., a set state, a reset state, or a "T" state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials (e.g., chalcogenide storage materials) may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge— Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a three-dimensional vertical pillar architecture having a plurality of vertically oriented (e.g., vertical) conductive pillars and a plurality of horizontally oriented (e.g., horizontal) access lines, as illustrated in FIG. 1. Embodiments of the present disclosure, however, are not limited to the example memory array architecture illustrated in FIG. 1. For example, embodiments of the present disclosure can include a cross-point architecture with memory cells (e.g., resistance variable cells) being located at intersections of a first and second signal lines used to access the cells (e.g., at topological cross-points between of word lines and bit lines). That is, embodiments of the present disclosure can include a three-dimensional cross-point memory array.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
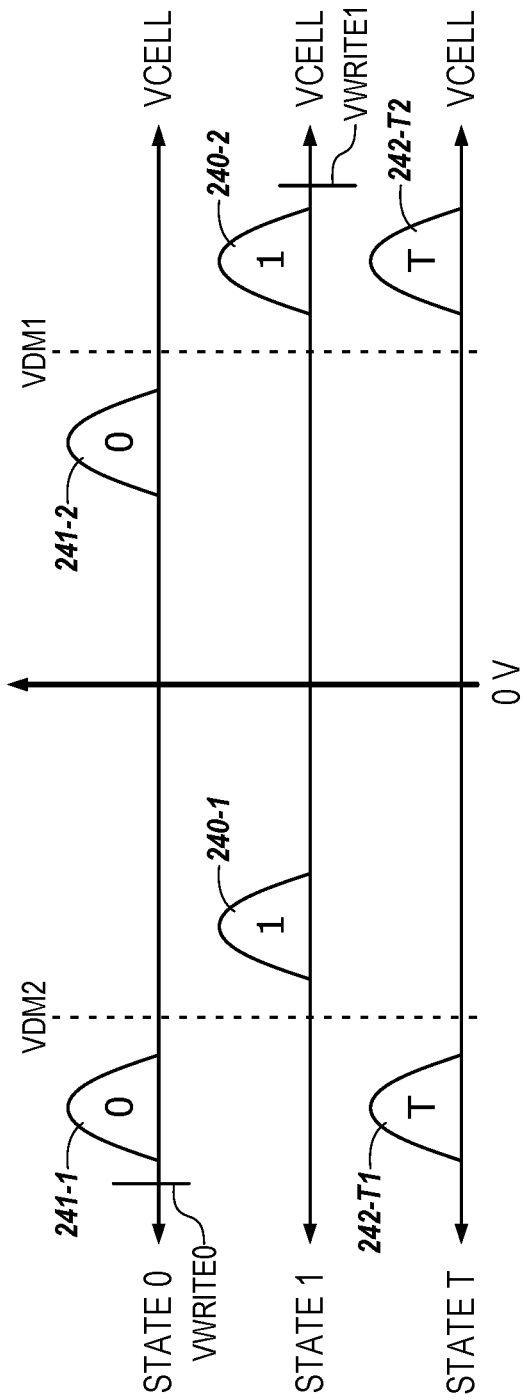
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of three possible data states (e.g., a first data state 0, a second state 1, or a third state T). That is, FIG. 2A illustrates threshold voltage distributions associated with three possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 240-1, 240-2, 241-1, 241-2, 242-T1, and 242-T2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
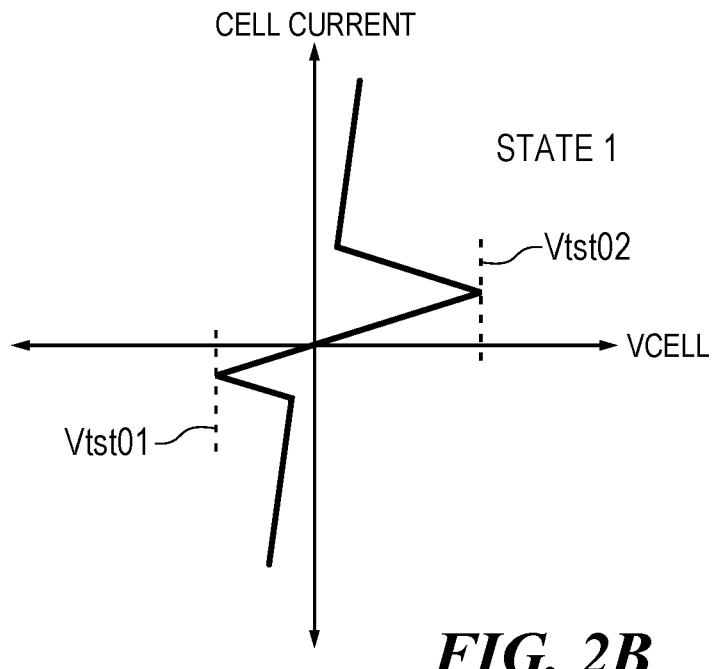
FIG. 2B is an example of a current-versus-voltage curve corresponding to a memory state of FIG. 2A, in accordance with an embodiment of the present disclosure.
Figure 2C:
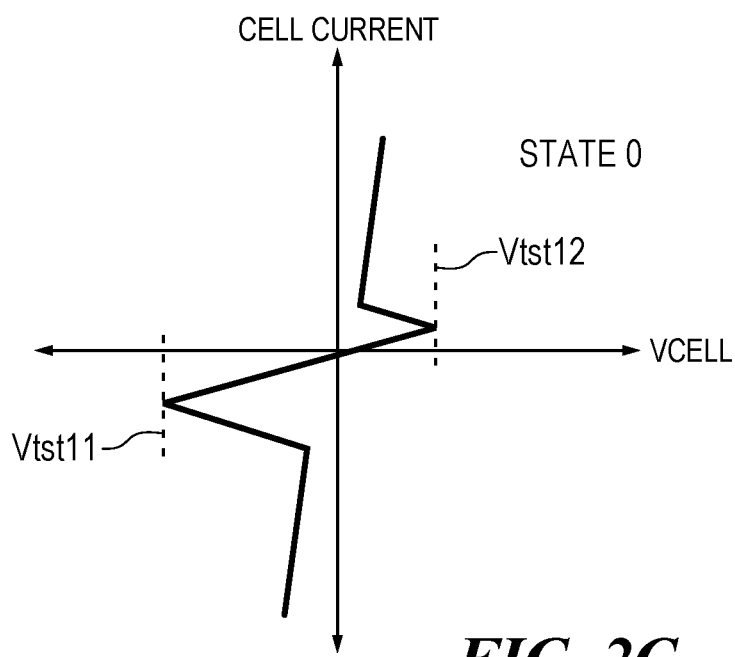
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 241-1 and 241-2) whose magnitude is greater for a negative polarity than a positive polarity, and a second data state (e.g., state 1) is associated with a second asymmetric threshold voltage distribution (e.g., threshold voltage distributions 240-1 and 240-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

In some examples, the magnitudes of the threshold voltages of a memory cell 125 in a particular state may be symmetric for different polarities, as shown in FIG. 2A. For example, the threshold voltage of a memory cell 125 programmed to state T may have the same magnitude in opposite polarities. For instance, in the example illustrated in FIG. 2A, a third data state (e.g., state T) is associated with a symmetric threshold voltage distribution (e.g., threshold voltage distributions 242-T1 and 242-T2) whose magnitude is substantially equal (e.g. high) for both a positive polarity and a negative polarity. In such an example, an applied voltage magnitude sufficient to cause a memory cell 125 to snap back can be the same for different applied voltage polarities.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 241-2) from cells in state 1 (e.g., threshold voltage distribution 240-2) or state T (e.g., threshold voltage distribution 242-T2). Similarly, VDM2 is a negative voltage used to distinguish cells in state 1 (e.g., threshold voltage distribution 240-1) from cells in state 0 (e.g., threshold voltage distribution 241-1) or state T (e.g., threshold voltage distribution 242-T1). In the examples of FIGS. 2A-2C, a memory cell 125 in a positive state 1 or T does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 or T does not snap back in response to applying VDM2.

Embodiments are not limited to the example shown in FIG. 2A. For example, the designations of state 0 and state 1 can be interchanged (e.g., distributions 241-1 and 241-2 can be designated as state 1 and distributions 240-1 and 240-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 240-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 240-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 241-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 241-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 241-2). As such, in a number of embodiments, a snapback event can be used to write a cell to the opposite state (e.g., from state 1 to state 0 and vice versa).

Figure 3:
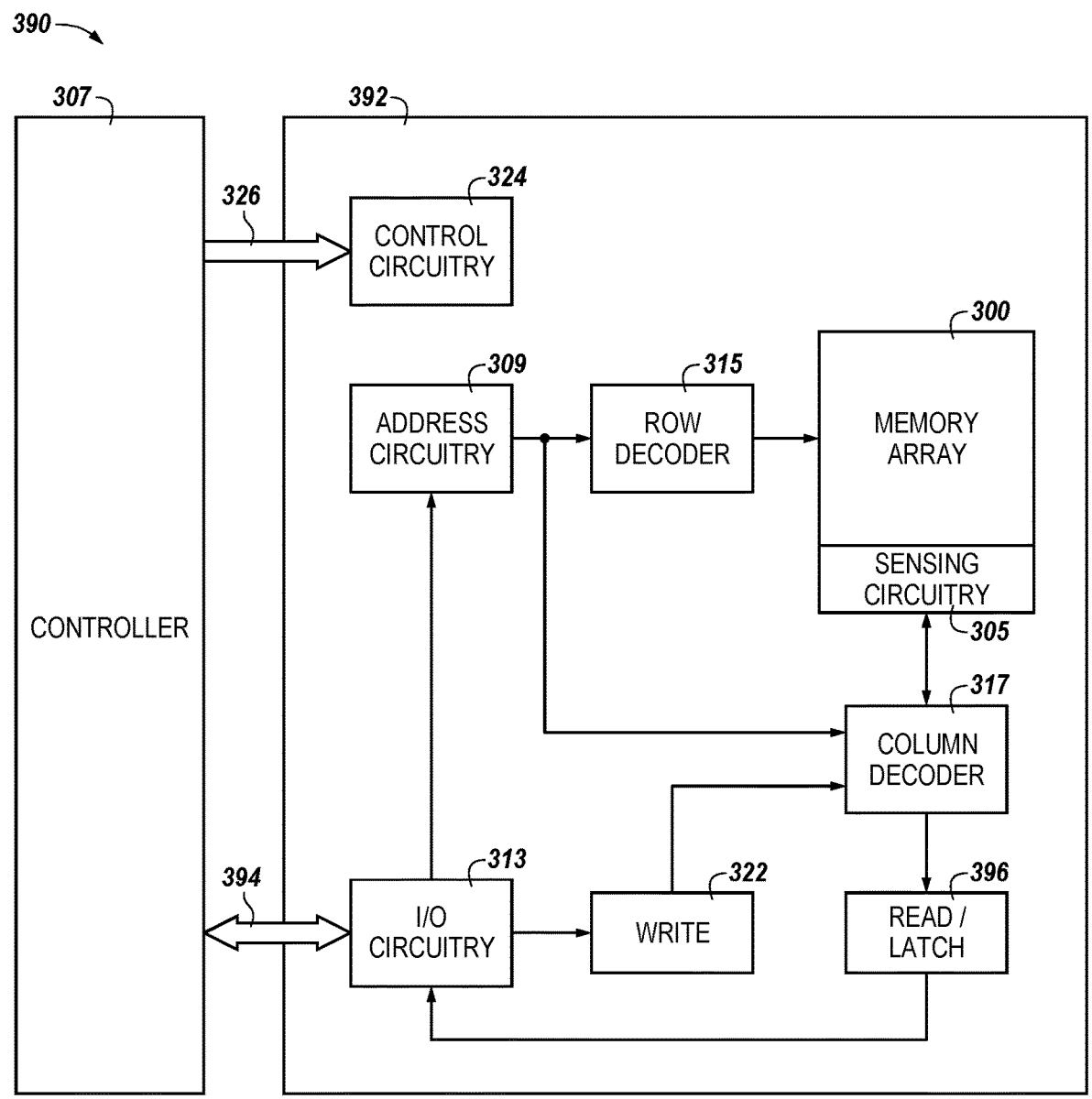
FIG. 3 is a block diagram illustration of an example apparatus, in accordance with an embodiment of the present disclosure.

FIG. 3 is a block diagram illustration of an example apparatus, such as an electronic memory system 390, in accordance with an embodiment of the present disclosure. Memory system 390 may include an apparatus, such as a memory device 392 and a controller 307, such as a memory controller (e.g., a host controller). Controller 307 might include a processor, for example. Controller 307 might be coupled to a host, for example, and may receive command signals (or commands), address signals (or addresses), and data signals (or data) from the host and may output data to the host.

Memory device 392 includes a memory array 300 of memory cells. For example, memory array 300 may include one or more of the memory arrays, such as a vertical pillar array, of memory cells disclosed herein. Memory device 392 may include address circuitry 309 to latch address signals provided over I/O connections 394 through I/O circuitry 313. Address signals may be received and decoded by a row decoder 315 and a column decoder 317 to access the memory array 300. For example, row decoder 315 and/or column decoder 317 may include drivers.

Memory device 392 may sense (e.g., read) data in memory array 300 by sensing voltage and/or current changes in the memory array columns using sense/buffer circuitry that in some examples may be read/latch circuitry 396. Read/latch circuitry 396 may read and latch data from the memory array 300. Sensing circuitry 305 may include a number of sense amplifiers coupled to memory cells of memory array 300, which may operate in combination with the read/latch circuitry 396 to sense (e.g., read) memory states from targeted memory cells. I/O circuitry 313 may be included for bi-directional data communication over the I/O connections 394 with controller 307. Write circuitry 322 may be included to write data to memory array 300.

Control circuitry 324 may decode signals provided by control connections 326 from controller 307. These signals may include chip signals, write enable signals, and address latch signals that are used to control the operations on memory array 300, including data read and data write operations.

Control circuitry 324 may be included in controller 307, for example. Controller 307 may include other circuitry, firmware, software, or the like, whether alone or in combination. Controller 307 may be an external controller (e.g., in a separate die from the memory array 300, whether wholly or in part) or an internal controller (e.g., included in a same die as the memory array 300). For example, an internal controller might be a state machine or a memory sequencer.

In some examples, controller 307 may be configured to perform a sense operation on a group of memory cells (e.g., a codeword) of memory array 300. Performing the sense operation can include, for example, performing a first (e.g., a first type of) sense operation in a first polarity on the group of memory cells to determine a quantity of the memory cells of the group that are in a particular data state, and subsequently (e.g., after performing the first sense operation) performing a second (e.g., a second type of) sense operation in a second polarity on the group of memory cells to determine the data state of the memory cells (e.g., of each respective cell) of the group. The second polarity can be opposite the first polarity. For instance, the first polarity can be a negative polarity, and the second polarity can be a positive polarity. Further, the particular data state can be a set data state. Further, the second sense operation can be a count-based sense operation that uses the quantity of memory cells determined to be in the particular data state by the first sense operation as a counting threshold (e.g., target) to determine the data state of the memory cells of the group (e.g., to read the codeword).

Performing the first sense operation in the first polarity can include applying a sensing voltage having the first polarity to the memory cells of the group, and performing the second sense operation in the second polarity can include applying a sensing voltage having the second polarity to the memory cells of the group. For instance, VDM2 described in connection with FIG. 2A can be used as the sensing voltage in the first sense operation, and VDM1 described in connection with FIG. 2A can be used as the sensing voltage in the second sense operation.

As an example, controller 307 can determine the quantity of the memory cells of the group that are in the particular data state by determining a quantity of the memory cells of the group that snap back during the first sense operation. For instance, controller 307 can include a counter (not shown) to count the quantity of cells that snap back. The second sense operation (e.g., the count-based sense operation) can then use the determined quantity of memory cells that snap back as the counting threshold to determine the data state of the memory cells of the group.

The determined data states of the memory cells of the group can be one of three possible data states. For instance, the determined data state of each respective memory cell of the group can be a reset data state, a set data state, or a "T" data state.

Performing the first sense operation can include, for example, executing a forward looking algorithm (FLA), and performing the second sense operation can include, for example, executing a counter-based algorithm (CBA). For instance, the first sense operation can determine the average threshold voltage of the memory cells of the group, and the second sense operation can use the determined average threshold voltage as a reference voltage, in conjunction with reading a target (e.g., reference) memory cell, to determine the data states of the memory cells of the group. The target memory cell can be one of the memory cells of the codeword, or can be an additional memory cell of memory array 300 (e.g., a memory cell that is not part of the codeword).

The sense window of the first sense operation can be larger than the sense window of the second sense operation. The sense window of a sense operation can refer to the voltage range between the threshold voltage distributions associated with the possible data states to which the memory cells can be programmed, and the sensing voltage used in the sense operation can be located within this range. For instance, with reference to FIG. 2A, the sense window can refer to the voltage range between distributions 240-1 and 241-1 and/or to the voltage range between distributions 240-2 and 241-2.

In some embodiments, controller 307 can store the quantity of memory cells of the group that are determined to be in the particular data state (e.g., the determined quantity of memory cells of the group that snap back during the first sense operation) in the group of memory cells (e.g., as part of the codeword). Controller 307 can then subsequently retrieve the determined quantity for use during the second sense operation to determine the data states of the memory cells of the group.

Controller 307 can perform an error correction operation, such as, for instance, an error correction code (ECC) operation, on the data states of the memory cells of the group determined by the second sense operation to correct the sensed data (e.g., to correct the read codeword). For instance, controller 307 can include error correction circuitry (not shown) to perform the error correction operation.

Controller 307 can program the data to the group of memory cells (e.g., program the codeword) prior to performing the sense operation. For example, in some embodiments, the data programmed to the group of memory cells can be balanced between the first (e.g., reset) data state and the second (e.g., set) data state (e.g., programming the data can include balancing the data programmed to the group of cells). For instance, the quantity of memory cells of the group programmed to the first data state can be equal to the quantity of memory cells of the group programmed to the second data state. Further, the data programmed to the group of memory cells can include data programmed to the third (e.g., T) data state, with the quantity of the memory cells of the group programmed to the third data state being less than the quantity of the memory cells of the group programmed to the first data state and the quantity of the memory cells of the group programmed to the second data state.

The data being programmed to the group of memory cells can be balanced by, for example, applying a balancing algorithm to the data. The balancing algorithm can be, for instance, a Knuth algorithm, such as a quantified Knuth algorithm, among other types of balancing algorithms.

Controller 307 can store the quantity of memory cells of the group programmed to the first data state and/or the quantity of memory cells of the group programmed to the second data state in additional memory cells of memory array 300 (e.g., memory cells that are not part of the group). The additional memory cells can be, for instance, extra (e.g., spare) memory cells of memory array 300 used to balance the codeword.

In embodiments in which the data programmed to the group of memory cells is balanced between the first data state and the second data state, controller 307 can perform the first sense operation on the group of memory cells, but need not determine or store the quantity of the memory cells of the group that are in the particular data state, or the quantity of the memory cells of the group that snap back, during the first sense operation. Rather, controller 307 can retrieve the quantity of memory cells of the group programmed to the first data state and/or the quantity of memory cells of the group programmed to the second data state from the additional memory cells of memory array 300, and use either of these quantities as the counting threshold in the second sense operation to determine the data states of the memory cells of the group.

Figure 4:
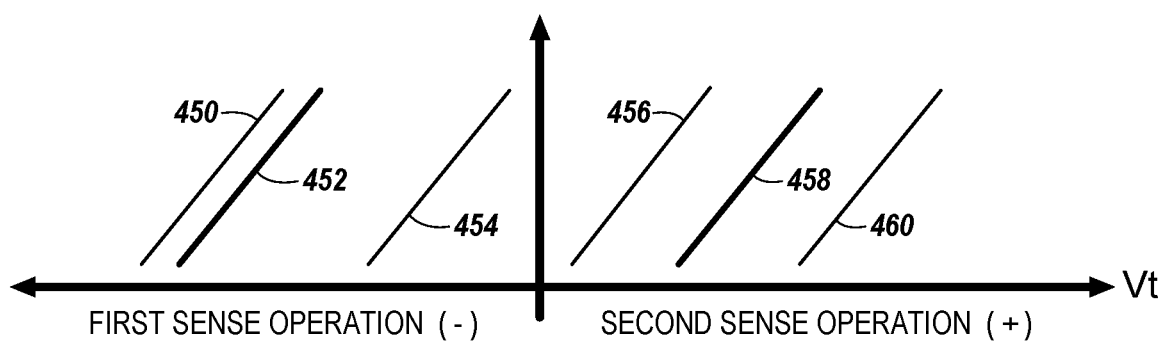
FIG. 4 illustrates a conceptual example of a sense operation performed in accordance with an embodiment of the present disclosure.

FIG. 4 illustrates a conceptual example of a sense operation performed in accordance with an embodiment of the present disclosure. For instance, FIG. 4 illustrates a conceptual example of threshold voltage distributions associated with the data states of a group (e.g., codeword) of memory cells, such as memory cells 125 illustrated in FIG. 1, on which a first sense operation in a first (e.g., negative) polarity and a second sense operation in a second (e.g., positive) polarity are being performed in accordance with the present disclosure.

For example, threshold voltage distributions 450, 452, and 454 illustrated in FIG. 4 represent the magnitudes of the threshold voltages to which the memory cells were programmed prior to performing the first sense operation. For instance, threshold voltage distribution 454 can be associated with a first (e.g., reset) data state, threshold voltage distribution 450 can be associated with a second (e.g., set) data state, and threshold voltage distribution 452 can be associated with a third (e.g., T) data state. In the example illustrated in FIG. 4, less memory cells have been programmed to the T data state than to the reset and set data states (e.g., as previously described herein). Accordingly, the threshold voltage distributions 450 and 452 for the set and T data states, respectively, can be in close proximity in the negative polarity, as compared to the proximity between threshold voltage distributions 452 and 454, as illustrated in FIG. 4. For instance, portions of threshold voltage distributions 450 and 452 overlap, as illustrated in FIG. 4. A first sense operation in the negative polarity can be performed on the memory cells, as previously described herein.

Threshold voltage distributions 456, 458, and 460 illustrated in FIG. 4 represent the magnitudes of the threshold voltages of the memory cells after the first sense operation has been performed on the memory cells. For instance, threshold voltage distribution 460 can be associated with the first (e.g., reset) data state, threshold voltage distribution 456 can be associated with the second (e.g., set) data state, and threshold voltage distribution 458 can be associated with the third (e.g., T) data state. As noted above, less memory cells have been programmed to the T data state than to the reset and set data states; however, the T data state is not completely depleted. As an example, at least 10% of the memory cells may be programmed to the T data state. Further, threshold voltage distributions 456, 458, and 460 may be evenly spaced, as illustrated in FIG. 4. For instance, a first portion of threshold voltage distribution 458 overlaps with a portion of threshold voltage distribution 456, a second portion of threshold voltage distribution 458 overlaps with a portion of threshold voltage distribution 460, and threshold voltage distribution 458 is not as close to threshold voltage distribution 460 as compared to the proximity between threshold voltage distributions 450 and 452, as illustrated in FIG. 4. Accordingly, a second sense operation in the positive polarity, and with a smaller sense window than the first sense operation, can be performed on the memory cells, as previously described herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a group of memory cells; and
   circuitry configured to perform a sense operation on the group of memory cells, wherein performing the sense operation includes:
     performing a first sense operation in a first polarity on the group of memory cells to determine a quantity of the memory cells of the group that are in a particular data state; and
     performing a second sense operation in a second polarity on the group of memory cells to determine a data state of the memory cells of the group, wherein:
       the second polarity is opposite the first polarity;
       the second sense operation is a count-based sense operation that uses the determined quantity of memory cells in the particular data state as a counting threshold to determine the data state of the memory cells of the group; and
       the determined data states of the memory cells of the group are one of three possible data states, wherein the three possible data states include:
         a first data state, wherein the first data state is associated with a first threshold voltage distribution whose magnitude is greater for the first polarity than the second polarity;
         a second data state, wherein the second data state is associated with a second threshold voltage distribution whose magnitude is greater for the second polarity than the first polarity; and
         a third data state associated with a third threshold voltage distribution whose magnitude is equal for the first polarity and the second polarity.

2. The apparatus of claim 1, wherein the circuitry is configured to store the determined quantity of memory cells in the particular data state in the group of memory cells.

3. The apparatus of claim 1, wherein the particular data state is a set data state.

4. The apparatus of claim 1, wherein:
   the first polarity is a negative polarity; and
   the second polarity is a positive polarity.

5. The apparatus of claim 1, wherein the circuitry is configured to perform an error correction operation on the determined data states of the memory cells of the group.

6. The apparatus of claim 1, wherein the memory cells of the group are self-selecting memory cells in which a single material serves as a select element and a storage element.

7. The apparatus of claim 6, wherein the single material is a chalcogenide material.

8. A method of operating memory, comprising;
   performing a sense operation on a group of memory cells, wherein performing the sense operation includes:
     performing a first sense operation in a first polarity on the group of memory cells, wherein performing the first sense operation on the group of memory cells comprises executing a forward looking algorithm;
     determining a quantity of the memory cells of the group that snap back during the first sense operation; and
     performing a second sense operation in a second polarity on the group of memory cells to determine a data state of the memory cells of the group, wherein:
       performing the second sense operation on the group of memory cells comprises executing a counter-based algorithm;
       the second polarity is opposite the first polarity; and
       the second sense operation is a count-based sense operation that uses the determined quantity of memory cells that snap back as a counting threshold to determine the data state of the memory cells of the group.

9. The method of claim 8, wherein the method includes storing the determined quantity of memory cells that snap back in the group of memory cells.

10. The method of claim 8, wherein the determined data states of the memory cells of the group are one of three possible data states.

11. The method of claim 10, wherein the three possible data states include:
    a first data state, wherein the first data state is associated with a first threshold voltage distribution whose magnitude is greater for the first polarity than the second polarity;
    a second data state, wherein the second data state is associated with a second threshold voltage distribution whose magnitude is greater for the second polarity than the first polarity; and
    a third data state associated with a third threshold voltage distribution whose magnitude is equal for the first polarity and the second polarity.

12. An apparatus, comprising:
a memory having a group of memory cells; and
circuitry configured to:
  program data to the group of memory cells, wherein:
    the data programmed to the group of memory cells is balanced between a first data state and a second data state;
    the data programmed to the group of memory cells includes data programmed to a third data state; and
    a quantity of the memory cells of the group programmed to the third data state is less than a quantity of the memory cells of the group programmed to the first data state and a quantity of the memory cells of the group programmed to the second data state; and
  perform a sense operation on the group of memory cells, wherein performing the sense operation includes:
    performing a first sense operation in a first polarity on the group of memory cells; and
    performing a second sense operation in a second polarity on the group of memory cells to determine a data state of the memory cells of the group, wherein:
      the second polarity is opposite the first polarity; and
      the second sense operation is a count-based sense operation that uses the quantity of the memory cells of the group programmed to the first data state or the quantity of the memory cells of the group programmed to the second data state as a counting threshold to determine the data state of the memory cells of the group.

13. The apparatus of claim 12, wherein the quantity of the memory cells of the group programmed to the first data state and the quantity of the memory cells of the group programmed to the second data state are equal.

14. The apparatus of claim 12, wherein the circuitry is configured to store the quantity of the memory cells of the group programmed to the first data state and the quantity of the memory cells of the group programmed to the second data state in additional memory cells of the memory.

15. The apparatus of claim 12, wherein the group of memory cells comprises a codeword.

16. The apparatus of claim 12, wherein the memory has a three-dimensional vertical pillar architecture.

17. A method of operating memory, comprising:
programming data to a group of memory cells, wherein programming the data includes balancing the data programmed to the group of memory cells between a first data state and a second data state; and
performing a sense operation on the group of memory cells to determine an average threshold voltage of the memory cells of the group, wherein performing the sense operation includes:
  performing a first sense operation in a first polarity on the group of memory cells; and
  performing a second sense operation in a second polarity on the group of memory cells to determine a data state of the memory cells of the group, wherein:
    the second polarity is opposite the first polarity;
    the second sense operation is a count-based sense operation that uses a quantity of the memory cells of the group programmed to the first data state or a quantity of the memory cells of the group programmed to the second data state as a counting threshold to determine the data state of the memory cells of the group; and
    the second sense operation uses the determined average threshold voltage as a reference voltage to determine the data state of the memory cells of the group.

18. The method of claim 17, wherein balancing the data programmed to the group of memory cells comprises applying a balancing algorithm to the data.

19. The method of claim 17, wherein:
the data programmed to the group of memory cells includes data programmed to a third data state; and
a quantity of the memory cells of the group programmed to the third data state is less than the quantity of the memory cells of the group programmed to the first data state and the quantity of the memory cells of the group programmed to the second data state.

20. The method of claim 17, wherein a sense window of the first sense operation is larger than a sense window of the second sense operation.

* * * * *